United States Patent
Valencia Rissetto et al.

(10) Patent No.: US 10,832,780 B2
(45) Date of Patent: Nov. 10, 2020

(54) METHOD FOR PROGRAMMING A NON-VOLATILE MEMORY DEVICE AND CORRESPONDING NON-VOLATILE MEMORY DEVICE

(71) Applicants: STMicroelectronics (Grenoble 2) SAS, Grenoble (FR); STMicroelectronics (Alps) SAS, Grenoble (FR)

(72) Inventors: Leonardo Valencia Rissetto, Montbonnot (FR); Elise Le Roux, Grenoble (FR); Christophe Forel, Grenoble (FR)

(73) Assignees: STMICROELECTRONICS (ALPS) SAS, Grenoble (FR); STMICROELECTRONICS (GRENOBLE2) SAS, Grenoble (FR)

( * ) Notice: Subject to any disclaimer, the term of this patent is extended or adjusted under 35 U.S.C. 154(b) by 0 days.

(21) Appl. No.: 16/432,369

(22) Filed: Jun. 5, 2019

(65) Prior Publication Data
US 2020/0005872 A1 Jan. 2, 2020

(30) Foreign Application Priority Data
Jun. 29, 2018 (FR) ..................................... 18 55927

(51) Int. Cl.
*G11C 16/06* (2006.01)
*G11C 16/10* (2006.01)
*G11C 16/04* (2006.01)

(52) U.S. Cl.
CPC .......... *G11C 16/10* (2013.01); *G11C 16/0425* (2013.01)

(58) Field of Classification Search
CPC . G11C 11/5628; G11C 16/10; G11C 16/0483; G11C 16/3418; G11C 16/12; G11C 16/3459; G11C 11/5621; G11C 2211/5621; G11C 16/26; G11C 16/3454; G11C 11/5635; G11C 16/34
USPC ............ 365/185.18, 185.22, 185.11, 185.03, 365/185.19, 185.2, 185.29, 185.17, 365/185.24, 185.02, 185.12, 218, 230.03
See application file for complete search history.

(56) References Cited

U.S. PATENT DOCUMENTS

| | | |
|---|---|---|
| 2002/0163837 A1 | 11/2002 | Wong |
| 2010/0146189 A1 | 6/2010 | Otterstedt et al. |
| 2019/0333579 A1* | 10/2019 | Grossi ................. G11C 13/0011 |

OTHER PUBLICATIONS

V. Della Marca, et al., "Push the flash floating gate memories toward the future low energy application", Solid-State Electronics, vol. 79 (2013), pp. 210-217.
J. Bartoli et al, "Optimization of the ATW non-volatile memory for connected smart objects", IEEE 2015, 4 pages.

* cited by examiner

*Primary Examiner* — Thong Q Le
(74) *Attorney, Agent, or Firm* — Slater Matsil, LLP

(57) ABSTRACT

A method can be used for programming a group of memory cells of a non-volatile memory device in a programming window that has a duration longer than a programming duration of a memory cell. The programming window is subdivided into a number of time intervals. A programming profile that was determined by simulation while taking into account a reference criterion is retrieved. The programming profile includes, for each time interval, a maximum number of memory cells that can be triggered for programming within each time interval. The memory device is programmed in the programming window, interval-wise, using the programming profile.

23 Claims, 4 Drawing Sheets

FIG.3
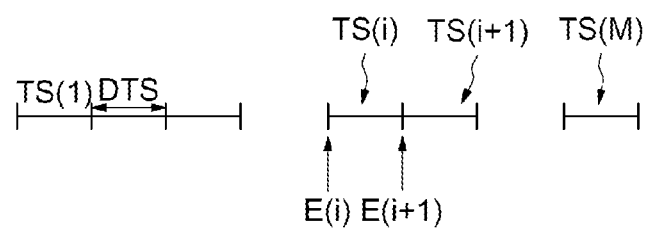
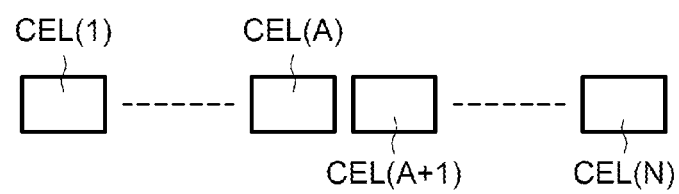

METHOD FOR PROGRAMMING A NON-VOLATILE MEMORY DEVICE AND CORRESPONDING NON-VOLATILE MEMORY DEVICE

CROSS-REFERENCE TO RELATED APPLICATIONS

This application claims priority to French Patent Application No. 1855927, filed on Jun. 29, 2018, which application is hereby incorporated herein by reference.

TECHNICAL FIELD

Implementations and embodiments of the invention relate to a method for programming a non-volatile memory device and a corresponding non-volatile memory device.

BACKGROUND

The logic value of a bit stored in a non-volatile memory cell is represented by the value of the threshold voltage of the floating-gate transistor of this memory cell. When the memory state is in an "erased" state, the logic value of the bit stored in this memory cell has a first value, for example, the value "1". The operation of programming an erased memory cell aims to make this cell pass to a "programmed" or "written" state in which the logic value of the bit stored in this memory cell has a second value, for example, the value "0".

Such memory cells, in particular split-gate memory cells, may be programmed by hot-electron injection or "hot carrier injection." Programming by hot-electron injection has, with respect to programming via the tunnel effect, the advantage of being of short duration, generally 100 times shorter than a tunnel-effect programming operation. More precisely, the programming time of a memory cell by hot-electron injection is typically about a few microseconds compared to a few milliseconds for a tunnel-effect programming operation.

During a hot-electron-injection programming operation, the two transistors of the memory cell interact with a view to injecting electrical charges into the floating gate. The selection transistor has a conductive channel in which there forms a current that comprises electrons of high kinetic energy, i.e., so-called "hot electrons." When this current reaches the conductive channel of the state transistor, an injection region forms in which the high-energy electrons are injected into the floating gate of this transistor under the effect of a vertical electric field created by the voltage applied to the control gate of the state transistor.

To obtain good injection efficiency, it is desirable for the selection transistor to operate in saturated mode (drain-source voltage very much higher than the gate-source voltage) in order for its conductive channel to have a pinch-off region in the vicinity of the injection region. The concentration of the current in the pinch-off region promotes the appearance of electrons of high kinetic energy, the injection efficiency then being high. This saturated operating mode of the selection transistor is also called the weak-inversion or subthreshold mode.

The saturated operating mode of the selection transistor is conventionally obtained by imposing a low programming current on the memory cell, by means of a current source, whereas the source-gate voltage of this selection transistor automatically adjusts to the imposed current, via a cascode effect.

To program a memory cell, the following are typically applied during a programming duration (programming pulse): a high voltage to the control gate of the state transistor (typically a voltage of about 10 volts), a voltage of about 1 volt to the gate of the selection transistor, and a voltage of about 4 to 5 volts to the drain of the state transistor.

During the programming pulse, a current profile appears. This current results from the generation of hot electrons. This generation of current takes the form of a peak at the start of the pulse, and then decreases throughout the programming operation.

Moreover, the various voltages applied to the memory cell during programming, and in particular the voltage applied to the bit line connected to the drain of the state transistor, are delivered by a charge-pumping circuit.

However, when many cells, for example, 64 memory cells, are programmed simultaneously, the various current peaks that appear on the corresponding bit lines require the charge-pumping circuit to be over-dimensioned and therefore its on-silicon size to be increased.

Specifically, if the charge pump is not capable of delivering this peak current, the voltage induced on the output of the charge pump may drop. In this case, programming cannot be guaranteed. Variations during the on-silicon fabrication of the memory cells aggravate this problem.

Thus, the amount by which the charge-pumping circuit must be over-dimensioned is increased.

The height of the programming peak is therefore a factor that affects the dimensions of the charge-pumping circuit, but also programming-operation robustness.

This current peak also appears during the programming of the memory cells of a FLASH memory, with the same drawbacks as regards the need to over-dimension the charge-pumping circuit.

This current peak has also been observed in an asymmetrical-tunnel-window (ATW) non-volatile memory cell, which is also programmable by hot-carrier injection and which is described in the article by J. Bartoli et al, entitled "optimization of the ATW non-volatile memory for connected smart objects", IEEE 2015.

One solution for decreasing the size of the charge-pumping circuit makes provision to program the memory cells using a plurality of programming pulses. This is programming parallelism.

Thus 64 memory cells will possibly for example, be programmed in a programming window the duration of which corresponds to two programming durations, using two consecutive programming pulses, thereby allowing 32 cells to be programmed per pulse.

Even if such a solution allows the maximum programming current in the programming window to be mechanically divided, a programming-current profile still has a peak in the same proportions. This situation does not allow the charge pump and its maximum current-generating capacity to be best employed.

SUMMARY

Implementations and embodiments of the invention relate to non-volatile memories, in particular embodiments, to non-volatile memories that are programmable by hot-electron injection, for example, memories comprising what are called split-gate memory cells each including a selection transistor and a floating-gate state transistor or indeed FLASH memories. Particular embodiments relate to memories embedded within an integrated circuit, for example, incorporating a microcontroller.

Embodiments of the invention can decrease the required maximum programming current and thereby allow the charge pump to be better used.

According to one implementation it is proposed, rather than dividing the value of the current, to change the shape of the programming-current profile so as to flatten, as much as possible, the current peak, thereby allowing the maximum current delivered by the charge pump to be useful throughout the programming window and no longer just for a short time at the start.

In this regard, according to one implementation, it is proposed to program the group of memory cells in an avalanche mode in the programming window using a programming profile established by simulation. The method includes, sequentially, checking the maximum programming current before permitting the operations of programming one or more additional memory cells of the group to be triggered within a time interval during which one or more memory cells of the group are already considered as having programming operations that are triggerable.

Thus, according to one aspect, a method is provided for programming a group of N memory cells of a non-volatile memory device in a programming window having a duration longer than the programming duration of a memory cell. The method comprises subdividing the programming window into M time intervals, M being higher than two, determining, by simulation, while taking into account a reference criterion, a programming profile including, for each time interval, a maximum number of memory cells the programming operations of which may be triggered within this time interval, (this maximum number may optionally be zero for certain of these time intervals), storing the programming profile in the memory device, and of programming the memory device in the programming window, interval wise, using the programming profile.

The number and the duration of the time intervals in particular depend on the desired precision.

According to one implementation, the method comprises determining, with a reference non-volatile memory device produced in the same technology as that of the non-volatile memory device, a variation as a function of time in the programming current of a reference memory cell of the reference memory device during the programming duration. The method also comprises determining the maximum programming-current value obtained in the programming window during operations of programming the N reference memory cells in P packets of N/P reference memory cells, P being lower than M, (for example, to program N=64 reference memory cells using two pulses, P is set equal to two 32 reference memory cells being programmed simultaneously). The reference criterion is that at the end of the intervalwise operations of programming the group of N memory cells. The maximum programming-current value does not exceed a fraction of the reference maximum value.

This fraction may, for example, be about 0.75, this corresponding to a 25% decrease in the current peak.

Of course these values are only indicative and the size of the desired decrease in particular depends on the technology used and on the height of the current peak.

The step of determining by simulation advantageously comprises implementing an algorithm that will make hypotheses, carry out tests and validate the hypotheses given the reference criterion.

More precisely, according to one implementation, the step of determining by simulation comprises ordering the memory cells of the group of N memory cells, defining at least one computational table including C coefficients that are associated with C computational times, sampling the variation as a function of time into D samples that are associated with D sampling times corresponding to D computational times, C being at least equal to the product of N multiplied by D, and ordering the M time intervals, a time interval of the sequence having a duration corresponding to DTS computational times and starting at an initial computational time, DTS being lower than D.

A memory cell of the group of N memory cells is considered to have a programming operation that is triggerable in a time interval if, after adding the D samples to the D preceding values, and therefore an accumulation, of the coefficients of the table, which coefficients are associated with the D computational times starting at the initial computational time of this time interval, the maximum value of the coefficients of the table does not exceed the fraction of the reference maximum value whereas if the maximum value of the coefficients of the table exceeds the fraction of the reference maximum value. The current memory cell is considered as not having a programming operation that is triggerable in this time interval.

According to one implementation, if the memory cell is considered to have a programming operation that is triggerable in the time interval, it is examined whether the programming operation of the following memory cell is triggerable in the same time interval by once again adding the D samples to the D preceding values of the coefficients of the table, which coefficients are associated with the D computational times starting at the initial computational time of the same time interval, and by determining whether the maximum value of the coefficients of the table does not exceed the fraction of the reference maximum value.

According to one implementation, if the memory cell is considered as not having a programming operation that is triggerable in the time interval, the D samples are not added to the D preceding values of the coefficients of the table, which values are associated with the D computational times starting at the initial computational time of this time interval, but, instead, they are added to the D values of the coefficients that are associated with the D computational times starting at the initial computational time of the following time interval, and it is determined whether the programming operation of this memory cell may or may not be triggered in the following time interval by comparing the maximum value of the coefficients of the table to the fraction of the reference maximum value.

Specifically, the immediately following interval is not necessarily the right one. In this case, the preceding procedures are repeated until a new time interval is obtained in which the operation of programming the memory cell will be able to be triggered. The D samples will then actually be added to the D preceding values of the coefficients of the table, which coefficients are associated with the D computational times starting at the initial computational time of this new time interval, only when enough preceding time intervals have been rejected. The one or more memory cells remaining to be programmed will be subjected to the reference criterion as specified above.

The step of determining by simulation advantageously comprises sequentially determining, memory cell after memory cell, in their order, the capacity of the programming operations of the memory cells to be triggerable in the designated time intervals, the intervals being considered sequentially in their order.

The memory cells are, for example, programmable by hot-carrier injection.

The memory device may be a FLASH memory device.

Each memory cell may be a split-gate memory cell.

The memory device may be embedded within an integrated circuit, for example, incorporating a microcontroller.

According to another aspect, a non-volatile memory device is provided, the device comprising a memory plane including memory cells, a register configured to store the programming profile obtained using the method such as defined above, and programming means configured to program a group of N memory cells in the programming window according to the programming profile.

According to one embodiment, the programming circuit is configured to program the memory plane in groups of N memory cells.

The memory cells are, for example, programmable by hot-carrier injection.

The memory device may be a FLASH memory device.

Each memory cell may be a split-gate memory cell.

The memory device may be embedded within an integrated circuit, for example, incorporating a microcontroller.

BRIEF DESCRIPTION OF THE DRAWINGS

Other advantages and features of the invention will become apparent on examining the detailed description of completely non-limiting implementations and embodiments and the appended drawings, in which:

FIGS. 1 to 5 illustrate various implementations and embodiments of the invention.

DETAILED DESCRIPTION OF ILLUSTRATIVE EMBODIMENTS

Figure 1:
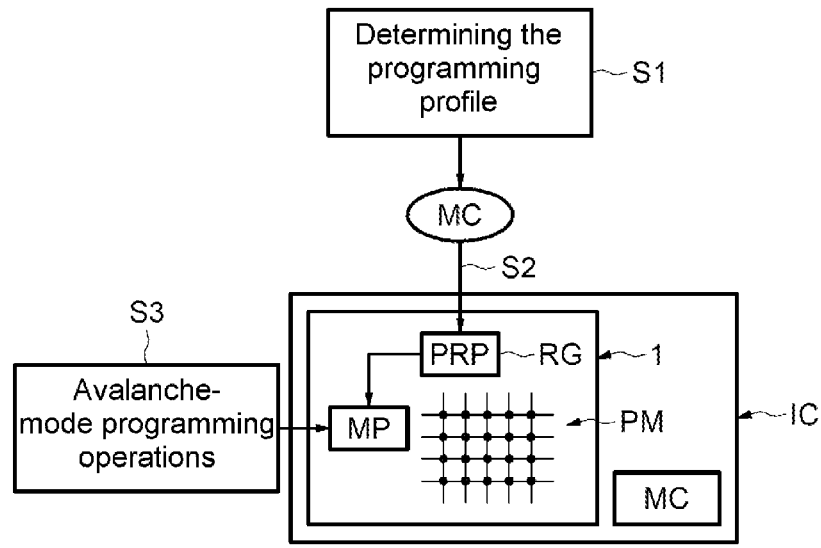

In FIG. 1, the reference IC designates an integrated circuit here incorporating a microcontroller MC and an embedded non-volatile RAM memory device 1.

This device 1 includes a memory plane PM possessing memory cells CEL that are arranged in a conventional way in rows and columns, and a programming circuit MP that is configured to program these memory cells, for example, in groups of N memory cells.

The structure of the programming circuit is conventional and known per se.

Apart from these circuits, the memory device 1 also includes a register RG that is configured to store a programming profile PRP more details on the structure of which will be given below.

This being so, it is already possible to note that this programming profile PRP is determined by simulation in a step S1.

Next, this programming profile is stored (step S2) in the register RG, so that, during the operation of the integrated circuit, and in particular of the memory device, the programming circuit MP are able to program the memory plane PM using the programming profile PRP contained in the register RG.

The memory cells are, for example, programmable by hot-carrier injection. The memory device may be a FLASH memory device.

The memory device may also be configured in such a way that each memory cell is a split-gate memory cell.

Of course, those skilled in the art will be able to adjust the structure of the programming circuit depending on the nature of the non-volatile memory device.

Figure 2:
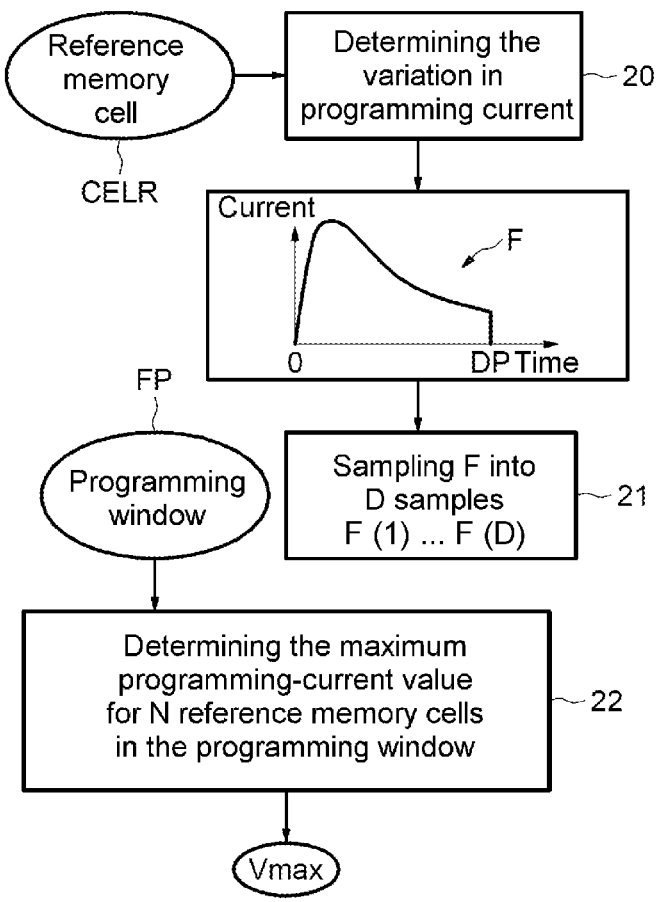
Figure 4:
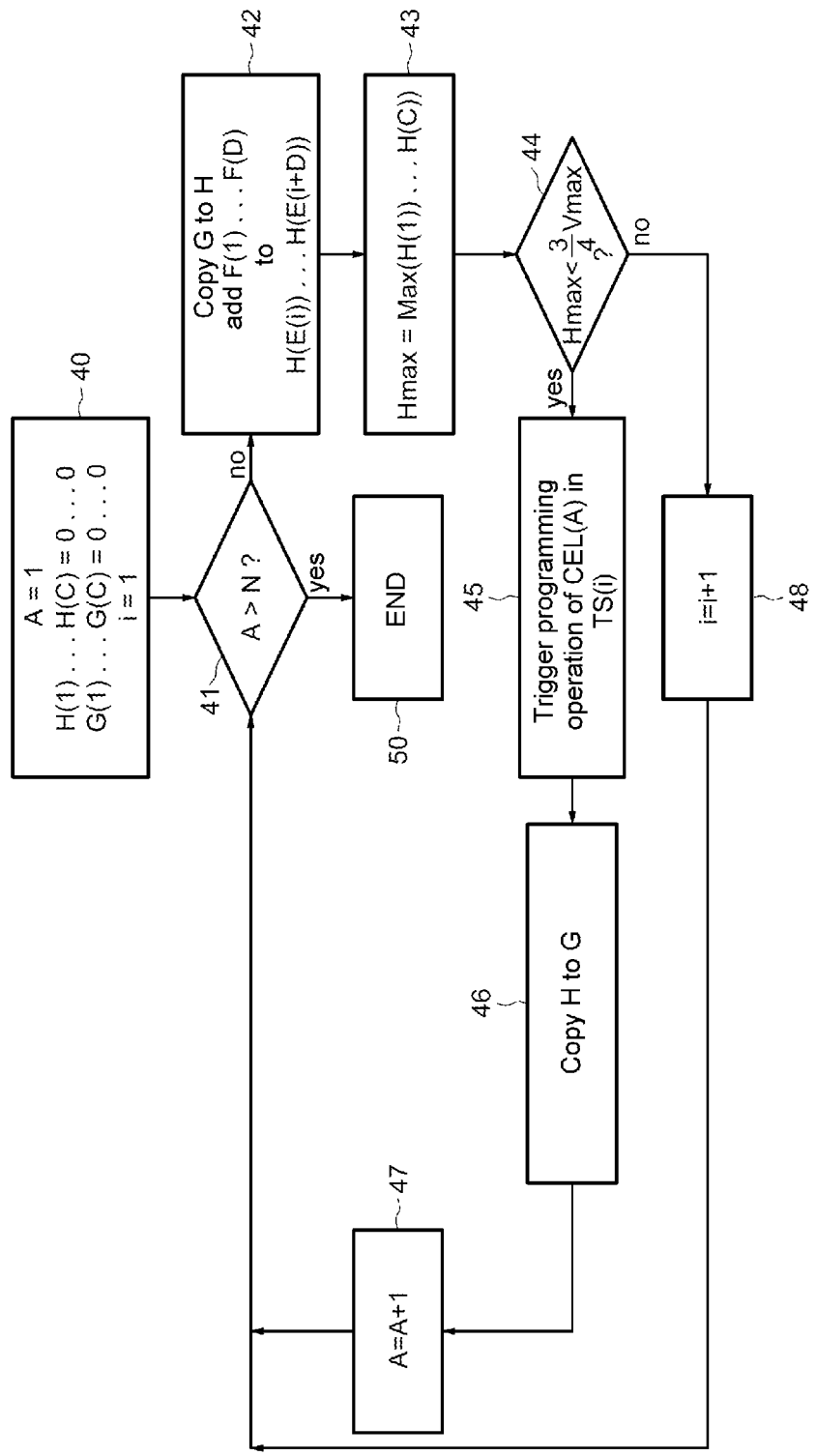

Reference is now more particularly made to FIGS. 2 to 4 to illustrate one implementation of the step of determining the programming profile PRP by simulation.

In practice, as will be described below, a window for programming N memory cells CEL is subdivided into M time intervals.

This programming window has a duration longer than the programming duration of a memory cell. It corresponds, for example, to a programming window already used in conventional programming methods. Thus, by way of indication, when it is desired to program a group of 64 memory cells, it is possible to choose, by way of programming window, the window conventionally used to program these 64 memory cells in 2 packets of 32 memory cells. The duration of the programming window is then about two times the programming duration of a memory cell (duration of a programming pulse).

Next, taking into account a reference criterion, more detail on the content of which will be given below, the programming profile will comprise a maximum number of memory cells the programming operations of which will be able to be triggered simultaneously in each time interval of the programming window.

Next, during the operation of the integrated circuit, and in particular of the memory device 1, the latter will be programmed in an avalanche mode (step S3), i.e., the programming operations of the number of cells that was determined will be triggered in succession in each time interval of the programming window, in accordance with the programming profile.

This will lead to a significant decrease in the current peak that was observed during the conventional programming operations of N memory cells, and therefore to the ability to use a charge-pumping circuit of smaller size.

The number M of time intervals is in particular related to the precision desired to obtain this result.

Those skilled in the art know how to choose this number M depending in particular on the envisaged applications and on the type of memory device.

As illustrated in FIG. 2, a reference memory cell CELR is first produced in the same technology as that of the memory cells CEL of the non-volatile memory device.

Next, a variation F in the programming current of the reference memory cell during the programming duration DP, which may be about 6 microseconds, is determined, typically by on-silicon measurements.

Next, this variation F as a function of time is sampled into D samples F(1) . . . F(D) (step 21).

As will be seen in more detail below, these D sampling times correspond to D computational times.

Once again, the number D depends on the desired precision.

By way of indication, D=6000 will possibly be chosen.

The maximum value V max of the programming current resulting from conventional operations of programming the N reference memory cells in P packets of N/P reference memory cells is also determined (step 22). In this example, N=64 and P=2.

As indicated above, the step of determining programming profiles PRP by simulation takes into account a reference criterion.

This reference criterion is here that at the end of this step of programming the group of N memory cells interval-wise, the maximum value of the programming current does not exceed a fraction of the reference maximum value V max.

By way of non-limiting indication, this fraction may be about 0.75, this leading to a 25% decrease in the current peak.

Reference is now more particularly made to FIGS. 3 and 4 in order to schematically describe an example of a simulating algorithm allowing the programming profile PRP to be determined, i.e., allowing, in the group of N memory cells, the maximum number of memory cells the programming operations of which may be triggered in each of the M time intervals to be determined.

In this regard, the decision as to whether or not to permit the programming operation of a current memory cell to be triggered in a time interval will take into account not only the programming current, and its variation as a function of time resulting from (an)other preceding memory cell(s) optionally being programmed in this time interval or in a preceding time interval, but also the variation, as a function of time, in the programming current, in the rest of the programming window, that will result from the programming operation of this current memory cell being triggered, so that the reference criterion is respected.

In this regard, as illustrated in FIG. 3, the memory cells CEL of the group of N memory cells are ordered so as to define a first memory cell CEL1, a current cell CEL(A), the following cell CEL(A+1) and lastly the last cell CEL(N) of the group.

A computational table or buffer TB1 containing C coefficients H(1) . . . H(C) associated with C computational times is also defined.

In practice, C is at least equal to the product of N multiplied by D.

The M time intervals TS(1) . . . TS(M) are also ordered.

A time interval TS(i) has a duration corresponding to DTS computational times. Moreover, a time interval TS(i) starts at an initial computational time E(i) (counted in number of computational times).

By way of indication, for N=64, and D=6000, C=400000 will possibly be chosen, for example.

The length DTS of each time interval TS (counted in number of computational times) is shorter than D.

Time intervals of 100 ns, for example, maybe used.

A second computational table (buffer) TB2 including coefficients G(1) . . . G(C) will also be defined for the sake of the example algorithm that will be described.

If FIG. 4 is now referred to, it may be seen that in an initializing step 40 the first memory cell (or first bit) to be programmed (A=1) is considered.

The first time interval (i=1) is also considered and the coefficients H(1) . . . H(C) and G(1) . . . G(C) of the tables TB1 and TB2 are initialized to zero.

In step 41, it is checked whether A is higher than N, i.e., whether all of the memory cells of the group of N memory cells have been treated.

If such is the case, then the algorithm terminates (step 50).

In the contrary case the content of the table TB2 is copied to the table TB1 and the D samples of the variation F as a function of time are added to the D values of the coefficients H(E(i)) . . . H(E(i+D)) of the table TB1, which coefficients are associated with the D computational times starting at the initial computational time E(i) of the time interval of rank i.

Next, in step 43, the maximum value H max of all of the C coefficients H(1) . . . H(C) of the table TB1 is extracted from this table TB1.

Next, in step 44, this value H max is compared to the fraction of the reference maximum value V max, in the present case to ¾ of this value.

If the value H max is actually lower than ¾ of V max, then this means that it is actually possible to trigger the operation of programming the cell CEL of index A, CEL(A), in the time interval TSi (step 45).

If a counter is associated with each time interval, the counter being intended to count the maximum number of memory cells the programming operation(s) of which is/are triggerable in this time interval, then the counter associated with this interval TSi will be incremented by 1.

Next, in step 46, the table TB1 will be copied to the table TB2 and the index A will be incremented by 1 (step 47).

In other words, it will now be examined whether the operation of programming the following memory cell CEL (A+1) may be triggered in the interval TSi by re-executing steps 42, 43 and 44.

If in step 44, H max remains below ¾ of V max, then this means that the cell of index A+1, CEL(A+1), may also have its programming operation triggered in the interval TSi.

If in step 44 relating to the cell CEL(A), H max is higher than or equal to ¾ of V max, then this means that this cell of index A cannot have its programming operation triggered in the interval TSi.

In this case, the index i is incremented by 1 (step 48), and it will be determined, by re-executing steps 42, 43 and 44, whether the memory cell of index A, CEL(A), may have its programming operation triggered in the following interval TS(i+1).

In this regard, it will be noted that, since in step 42 the second table TB2 is copied to the first table TB1 without having carried out step 46 beforehand (copy of the table TB1 to the table TB2), the addition of the samples F(1) . . . F(D) that was carried out beforehand has in fact been cancelled and this time round these samples F(1) . . . F(D) are added to the D values of the coefficients H(E(i+1)) . . . H(E(i+1+D)) that are associated with the D computational times starting at the initial computational time E(i+1) of the following time interval TS(i+1) of rank i+1.

In general, a memory cell the programming operation of which cannot be triggered in a given interval may have its programming operation triggered in the following interval.

This being so, it could also be envisaged that it be necessary to wait one or more following time intervals to trigger the programming operation of the memory cell.

At the end of this algorithm, the maximum number of memory cells the programming operation(s) of which may be triggered within each time interval is therefore known for each time interval.

As indicated above, in operation, the programming circuit will program the memory plane in groups of N memory cells according to this programming profile.

Figure 5:
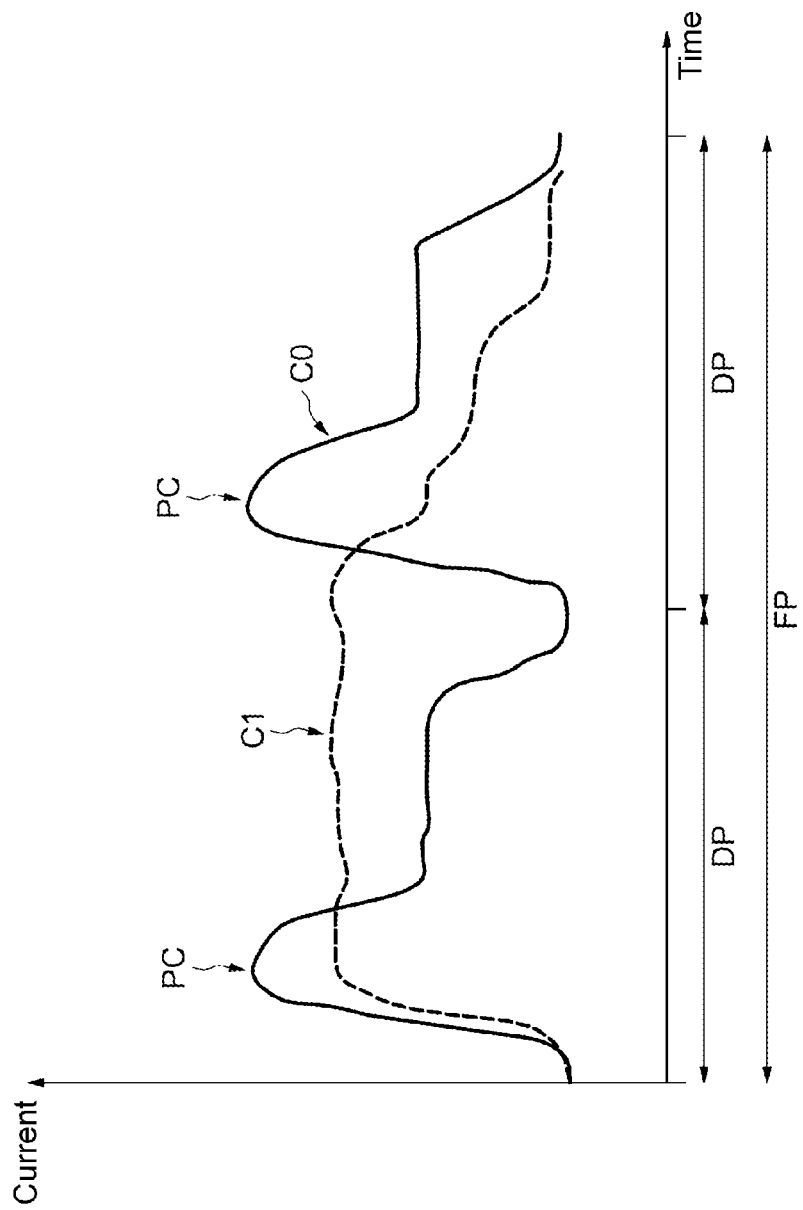

By way of example, FIG. 5 illustrates two variations in the programming current required to program N memory cells, allowing comparison between conventional operations of programming in P packets of N/P memory cells and (interval-wise) avalanche-mode programming operations.

In FIG. 5, the curve C1 illustrates the variation as a function of time in the programming current for conventional operations of programming (in the programming window FP) 64 memory cells in 2 packets of 32 memory cells, the 32 memory cells being programmed simultaneously over the programming duration DP of a memory cell (duration of the programming pulse).

It will be noted that the curve C1 includes two current peaks PC the height of which is equal to 32 times the height of a current peak resulting from the operation of programming a single memory cell.

The curve C1 illustrates the variation as a function of time in the programming current for avalanche-mode operations of programming these 64 memory cells in the same programming window according to the programming profile obtained with the algorithm described, by way of example, with reference to FIGS. 3 and 4.

It will be noted that the curve C1 has become spread, and that it has a maximum height decreased by 25% with respect to the height of the current peaks PC.

The programming window FP has a duration longer than the programming duration DP of one memory cell but shorter than if all the memory cells had to be programmed with a conventional method of the type described in the aforementioned article by Bartoli et al. This is the result of the closeness in time of the programming pulses of the various memory cells, this closeness resulting from the method that has just been described.

What is claimed is:

1. A method for programming a group of N memory cells of a non-volatile memory device in a programming window that has a duration longer than a programming duration of a memory cell, N being a real number, the method comprising:
   subdividing the programming window into M time intervals, M being an integer greater than two;
   determining a programming profile that includes, for each time interval, a maximum number of memory cells that can be triggered for programming within the time interval, the programming profile being determined by simulation while taking into account a reference criterion;
   storing the programming profile in the memory device; and
   programming the memory device in the programming window, interval-wise, using the programming profile.

2. The method according to claim 1, further comprising:
   determining, with a reference non-volatile memory device produced in the same technology as that of the non-volatile memory device, a variation as a function of time in the programming current of a reference memory cell of the reference non-volatile memory device during the programming duration; and
   determining a maximum programming-current value obtained in the programming window during operations of programming the N reference memory cells in P packets of N/P reference memory cells, P being lower than M;
   wherein the reference criterion is that at the end of the interval-wise programming of the group of N memory cells; and
   wherein the maximum programming-current value does not exceed a fraction of a reference maximum value.

3. The method according to claim 2, wherein determining the programming profile comprises:
   ordering the memory cells of the group of N memory cells;
   defining a computational table that includes C coefficients that are associated with C computational times;
   sampling a variation as a function of time into D samples that are associated with D sampling times corresponding to D computational times, C being at least equal to N multiplied by D; and
   ordering the M time intervals, a time interval of a sequence having a duration corresponding to DTS computational times and starting at an initial computational time, DTS being lower than D.

4. The method according to claim 3, wherein a memory cell of the group of N memory cells is considered to have a programming operation that is triggerable in a time interval if, after adding the D samples to the D preceding values of the coefficients of the table, which coefficients are associated with the D computational times starting at an initial computational time of this time interval, a maximum value of the coefficients of the table does not exceed the fraction of the reference maximum value whereas if the maximum value of the coefficients of the table exceeds the fraction of the reference maximum value, the memory cell is considered as not having a programming operation that is triggerable in the time interval.

5. The method according to claim 4, wherein, when the memory cell is considered to have a programming operation that is triggerable in the time interval, the method comprises examining whether the programming operation of the following memory cell is triggerable in the same time interval by once again adding the D samples to the D preceding values of the coefficients of the table, which coefficients are associated with the D computational times starting at the initial computational time of the same time interval, and by determining whether the maximum value of the coefficients of the table does not exceed the fraction of the reference maximum value.

6. The method according to claim 4, wherein, when the memory cell is considered as not having a programming operation that is triggerable in the time interval, the D samples are not added to the D preceding values of the coefficients of the table, which coefficients are associated with the D computational times starting at the initial computational time of this time interval, but, instead, the D samples are added to the D values of the coefficients that are associated with the D computational times starting at the initial computational time of the following time interval, the method further comprising determining whether the programming operation of this memory cell may or may not be triggered in the following time interval by comparing the maximum value of the coefficients of the table to the fraction of the reference maximum value.

7. The method according to claim 3, wherein determining by simulation comprises sequentially determining, memory cell after memory cell, in their order, a capacity of the programming operations of the memory cells to be triggerable in designated time intervals, the intervals being considered sequentially in their order.

8. The method according to claim 2, wherein the fraction is about 0.75.

9. The method according to claim 1, wherein the memory cells are programmable by hot-carrier injection.

10. The method according to claim 9, wherein the memory device is a FLASH memory device.

11. The method according to claim 9, wherein each memory cell is a split-gate memory cell.

12. The method according to claim 9, wherein the memory device is embedded within an integrated circuit incorporating a microcontroller.

13. A method for programming a group of memory cells of a non-volatile memory device in a programming window that has a duration longer than a programming duration of a memory cell, the method comprising:
   subdividing the programming window into a plurality of time intervals;
   retrieving a programming profile that was determined by simulation while taking into account a reference criterion, the programming profile including, for each time interval, a maximum number of memory cells that can be triggered for programming within each time interval; and programming the memory device in the programming window, interval-wise, using the programming profile.

14. The method according to claim 13, wherein the memory cells are programmable by hot-carrier injection.

15. The method according to claim 14, wherein the memory device is a FLASH memory device.

16. The method according to claim 14, wherein each memory cell is a split-gate memory cell.

17. The method according to claim 14, wherein the memory device is embedded within an integrated circuit incorporating a microcontroller.

18. A non-volatile memory device comprising:
a memory plane including memory cells;
a register storing a programming profile that was determined by simulation while taking into account a reference criterion, the programming profile including, for each time interval of a number of time intervals in a programming window, a maximum number of memory cells that can be triggered for programming within each time interval, the programming window has a duration longer than a programming duration of a memory cell, the number of time intervals being an integer greater than two; and
a programming circuit configured to program a group of N memory cells for the duration of the programming window according to the associated programming profile for each time interval in the programming window, N being a real number.

19. The device according to claim 18, wherein the programming circuit is configured to program the memory plane in groups of N memory cells, N being an integer greater than two.

20. The device according to claim 18, wherein the memory cells are programmable by hot-carrier injection.

21. The device according to claim 20, wherein the memory device is a FLASH memory device.

22. The device according to claim 20, wherein each memory cell is a split-gate memory cell.

23. The device according to claim 18, wherein the non-volatile memory device is embedded within an integrated circuit incorporating a microcontroller.

* * * * *